United States Patent [19]
Nagai

[11] Patent Number: 4,714,797
[45] Date of Patent: Dec. 22, 1987

[54] COMPOSITE ELECTROMOTIVE APPARATUS UTILIZING SOLAR ENERGY AND THE LIKE

[76] Inventor: Toki Nagai, 9-4, Tairamachi 1-chome, Meguro-ku, Tokyo, Japan

[21] Appl. No.: 648,556

[22] PCT Filed: Oct. 26, 1983

[86] PCT No.: PCT/JP83/00379
 § 371 Date: May 9, 1985
 § 102(e) Date: May 9, 1985

[87] PCT Pub. No.: WO84/02584
 PCT Pub. Date: Jul. 5, 1984

[30] Foreign Application Priority Data
Dec. 28, 1982 [JP] Japan ............... 57-229846

[51] Int. Cl.[4] ............................................. H01L 35/00
[52] U.S. Cl. ..................................... 136/206; 136/243
[58] Field of Search ............................... 136/206–214, 136/243–252

[56] References Cited
U.S. PATENT DOCUMENTS

| | | | |
|---|---|---|---|
| 3,053,923 | 9/1962 | Stearns | 136/206 |
| 3,293,082 | 12/1966 | Brouwer et al. | 136/206 |
| 3,977,909 | 8/1976 | Cremonese | 136/206 |
| 4,002,499 | 1/1977 | Winston | 136/206 |
| 4,147,561 | 4/1979 | Knight | 136/206 |
| 4,257,823 | 3/1981 | Bevilacqua et al. | 136/206 |

Primary Examiner—Donald P. Walsh
Assistant Examiner—T. J. Waller
Attorney, Agent, or Firm—Kane, Dalsimer, Kane, Sullivan & Kurucz

[57] ABSTRACT

This invention deals with a composite electromotive apparatus utilizing solar energy and the like, comprising composite electromotive elements such as a thermoelectromotive unit, a photovoltaic unit, a magnetic electromotive unit utilizing convection, radiation, and/or other phenomena and so forth, to aim to gain electromotive even if momentarily small but as often as possible, with less limits in spite of any conditions, environment, etc., but without taking huge spaces and the like.

10 Claims, 13 Drawing Figures

FIG.I(A)
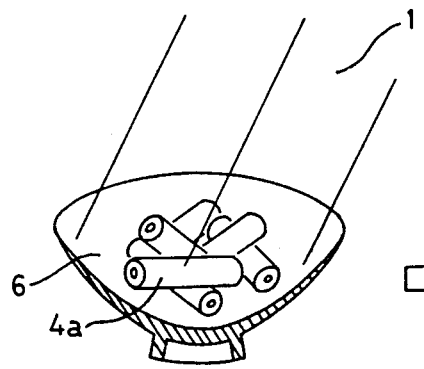
FIG.I(A')
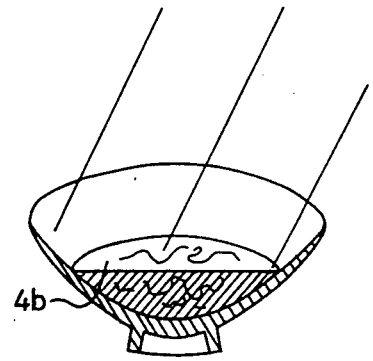
FIG.I(B)
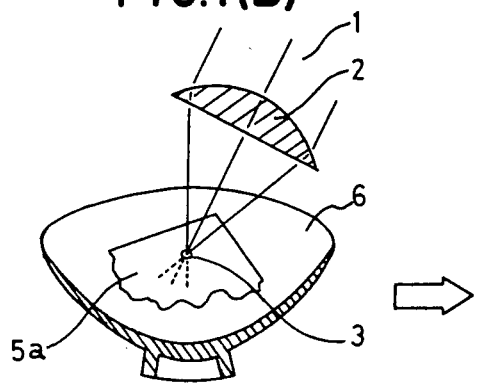
FIG.I(B')
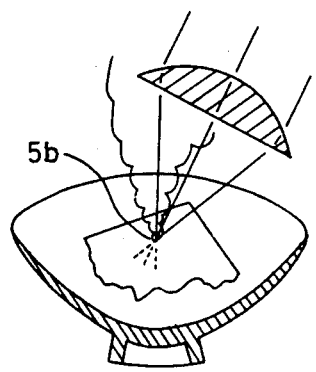

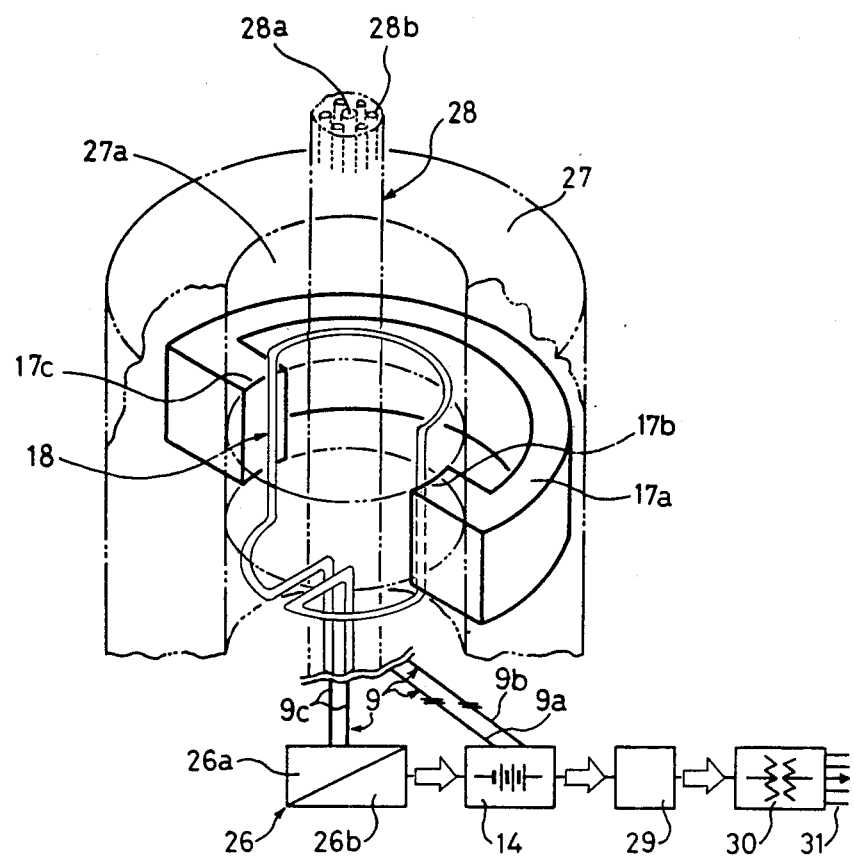
FIG. 4
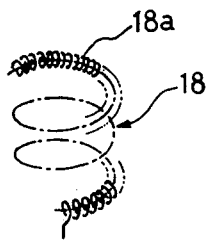

COMPOSITE ELECTROMOTIVE APPARATUS UTILIZING SOLAR ENERGY AND THE LIKE

BACKGROUND

In the case of usual electromotive devices and/or electric generators consisted of a single element system, e.g., as for a hydroelectric generator system, etc., of course, there may be lots of merits such as in reversely utilizing a generator as a motor for pumping-up and/or tail-watering, and others; as for a thermoelectric steam power plant system, etc., there may be some problems in thermosources, including huge intermediate functional facilities, etc., such as turbine operation and the like with much loss to lots of energy conversion and/or equipment loss and others; as for a wind power plant system, etc., there may be some difficulties in stabilization due to the unstable, regional and/or climatic situation and some problems in efficiency, etc.; as for a nuclear power plant system, etc., though it has already been promoted to be practicable, there lurk such difficulties not to be trusted in it with a question whether to actually execute or not due to the problem of leakage though it is said logically it is safe; as for development of a solar energize electric generators and/or electromotivators, as well as the case of thermoelectric power plant system, in the case of utilization of solar heat, there may be great loss due to lots of processes of the return of energy because of the intention for utilizing it as a motive power for turbine operation, etc.; and in the case of utilization of solar light, a problem is the decrease in photovoltaic force due to solar heat, removing which has been an aimed subject; and the like. Besides, the usual generators and/or electromotivators have required huge areas and/or shifting, great deal of sources and motive forces and driving systems, etc.

This invention aims to gain such a conposite electromotive apparatus utilizing solar energy and the like, without requiring huge and complicated spaces, sources, motive powers, mechanisms, facilities and the like, which would be used; but by making necessary electromotive elements into one composite body, it is possible for this to be usefully designed in either type of a body, small or jumbo, single or compound, or others; enabling its utilization other than as an electric generator of the power station. Moreover, utilities for exclusive facilities, plant-installed elements, setting on an individual building, and for installing on fixed facilities, etc., or for an accessory of moving substances, equipment, etc., or for portable use, in single-body types, including in compound types such as compound eyes, bunchy in fluorescences, plain boards, or others; the individual essential body itself of which is aimed to be as simplified in its effective elements, and efficiently composed to be with much efficiency.

EXPLANATION OF THE INVENTION

Thus, this invention concerns such a composite electromotive apparatus utilizing solar energy and the like; a thermoelectromotive unit, with (a) thermocouple(s) etc., the high-temperature part of which is/are positioned at the focal point of the lens, as a thermoelectromotive element; a photovoltaic unit, removing heat from a photo-accepter by means of a fan utilizing convection, radiation, and/or other phenomena, for making its photovoltaic force effective; a magnetic electromotive unit, with a device enabling so-called 'magnetic generation' directly or indirectly by the fan's rotation; and so forth.

With the above, by means of the mutually multiplied effects of composite electromotivation, this aims to always and efficiently gain electromotive increase, without wasting huge spaces or complicated related-facilities etc.

BRIEF DESCRIPTION OF THE DRAWINGS

Drawings concern this invention of the composite electromotive apparatus utilizing solar energy and the like as follows: FIG. 1, with both (A) and (B), shows an explanatory principle-illustration drawing of this invention; FIG. 4 shows a detailed schematic and isometric drawing of an illustrated neck construction of the said body, representing a typical assembly of the magnetic electromotive unit (direct-mode) which is a component of this inventional apparatus, with a brief block diagram of its connecting devices, circuits, etc., which are similar to those in other illustrations.

THE BEST FORM OF EXECUTION OF THIS INVENTION

Figure 2A:
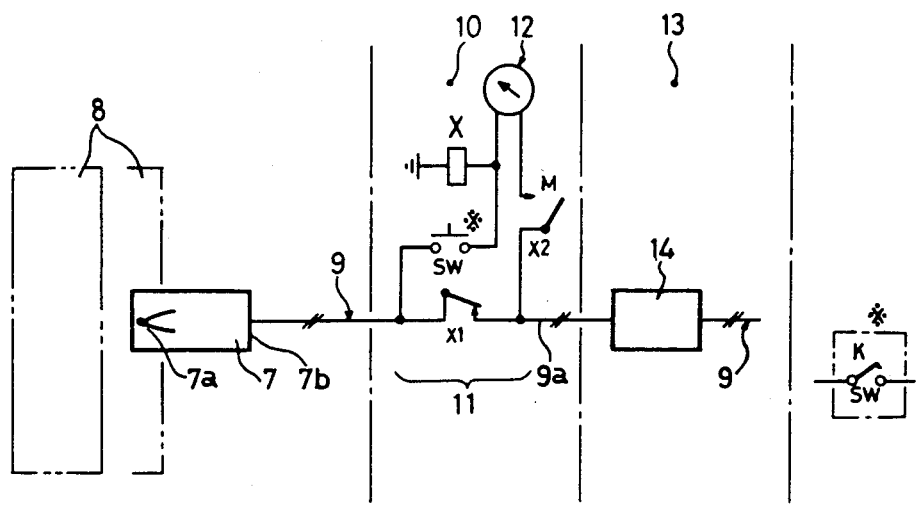
FIG. 2 shows an illustration of circuit- and system-diagrams of reversed utilization of a thermocouple-thermometer as a thermoelectromotivator (-motive device), obtainable of such possibility as that a thermocouple may be utilized as a thermoelectromotive substance used as a thermoelectromotivater. (A) represents a serial switching circuit inserted in an off-line and real time system of a thermal indicator type thermocouple, i.e., a thermometer for transient measurement; (B) represents parallel circuits of an on-line and remote-batch system, consisted of a circuit provided with a thermocouple always thermo-measuring, indicating, and monitored and other circuits provided with other thermocouple(s) exclusively for electromotivation, together with battery connection, etc.

To describe the execution state of this invention, if explaining it with the attached drawings etc., it becomes as follows:

FIG. 1, with both (A) and (B), shows an explanatory principle-illustration drawing of this invention, representing possibility for application of the real case with the principle of the natural phenomena, to an apparatus/devices designed; this inventional apparatus is one of those in which the said principle and phenomena are emphasized and utilized for its design. It has been obtained that: With the sunlight 1, i.e., spring day direct sunshine in Tokyo, for about 20 minutes, various colored pieces of crayon 4a put in a small white ceramic bowl 6 (shown in (A)) become into each-other melted and colorfully mingled pasty crayon solution 4b (as (A')). (It means that in approximately over 60° C.) Cooling the bowl with cold water or the like, the pasty solution liquid-like becomes a colorfully mingled crayon 4b solid (solidified) in shape of the bowl bottom with a horizontal top-plane, having a teeth stick or the like put in the solution, after solidified, taking the mingled crayon out; next, as shown in (B), if putting a piece of black paper 5a in the empty bowl 6, and applying the said sunlight 1 through a convex lens 2 with a diameter of approx. 4 cm, and a focal distance of approx. 5 cm, focusing at its focal point 3 on the black paper piece 5a, as shown in (B'), the focal point on the blak pater piece 5b burns in approx. 1~2 seconds. (It means over 100° C.) Thus, it is what the above natural phenomena have been applied that the essential composition of this apparatus.

FIG. 2 shows an illustration of circuit- and system-diagrams of reversed utilization of a thermocouple-thermometer as a thermoelectromotivator (-motive device), obtainable of such possibility as that a thermocouple, which is one of the main components of this inventional apparatus, may be utilized as a thermoelectromotive substance used as a thermoelectromotivator; as follows: (A) represents the case of a serial switching circuit incerted in an off-line and real time system of a thermal indicator type thermocouple, i.e., a thermometer for transient measurement; and (B) represents the case of parallel circuits of an on-line and remote-batch system, consisted of a circuit provided with a thermocouple always thermo-measuring, indicating, and monitored and other circuits provided with other thermocouple(s) exclusively for electromotication, together with battery circuit connection, etc.

In FIG. 2, first, as for a thermocouple, which is a main component of this invention, it has been already well-known that the thermoelectromotive force caused by the Seebeck effect including the Pertier effect of thermocouples (; as for their thermoelectromotive force values varied by their materials, they are as shown in, e.g., JIS C 1602, ISA (Type S), etc.; besides, as for existing thermocouples, if necessary, their protecting tubes, including their compensating leading wires, moreover, as for thermocouple material electric resistance etc., or their construction and so forth, as shown in the abave data/standards, see JIS C 1601 (1960) etc.). From the viewpoints of their thermoelectromotive force relying on their materials, their work limits, and others, expected are effect and the like of CA etc.; only, which should be defferently selected according to the ambient conditions and others, at their material selection and so forth.

As the principle of utilizing method of thermocouples, in this invention, as for a thermoelectromotive substance, i.e., a thermoelectromotivator, thermocouple, i.e. a junction pyrometer, obtained are as follows: As having been already well-known, with the construction consisting of a thermocouple and a temperature measuring circuit by electromotive force, the thermocouple thermometers/junction pyrometers are more excellent in heat-resistance than temperature measuring electric resistance, and so, (of course, starting from approx. 200° C.;) with a standard range of around 600°~100° C., it is possible for them to measure, according to their materials such maximum ranges of temperature as those: in the case of CA:- up to 1200° C., PR:- up to 1600° C., and the like. Since the measuring method of the thermocouple-thermometers/junction pyrometers is that: by measuring the thermoelectromotive force of the thermocouple, temperature difference between the two junction points is read through a millivoltmeter, the voltage differentiation is only concerned to two kinds of metals and the temperature differentiation between the junction points; besides, the thermocouples materials' characteristics are essencially provided with: (1) thermoelectromotive force per unit temperature variation to be large and to have a

| VARIOUS THERMOMETERS | | | | | | | | | | | |
|---|---|---|---|---|---|---|---|---|---|---|---|
| | Temperature [°C.] | | | | | | | | | | Accuracy |
| Thermometer | −200 | 0 | 200 | 400 | 600 | 800 | 1000 | 1200 | 1400 | 1600 | 1800 | [°C.] |
| Mercury Th. | ——— | | | | | | | | | | | ±0.1~1 |
| Alcohol Th. | ——— | | | | | | | | | | | ±0.5~1 |
| Bimetal Th. | | | ——— | | | | | | | | | ±2~15 |
| Resistance Th. | ——————— | | | | | | | | | | | ±0.01~2 |
| Thermocouple Th.* | ——————————————— | | | | | | | | | | | ±0.1~10 |
| Radiation Pyrometer | | | | | ——————————————— | | | | | | | ±10~20 |
| Optical Py./Th. | | | | | | ——————————— | | | | | | ±5~15 |
| Colar Py./Th. | | | | | | ——————————— | | | | | | ±5~15 |

| TYPICAL THERMOCOUPLES** | | | | | | | | | | | |
|---|---|---|---|---|---|---|---|---|---|---|---|
| Types of | Temperature [°C.] | | | | | | | | | | |
| Thermocouples | −200 | 0 | 200 | 400 | 600 | 800 | 1000 | 1200 | 1400 | 1600 | 1800 |
| Cu—Constantan | ——— | | | (line element diameter: 1 mm) | | | | | | | |
| Fe—Constantan | ——— | | | | (1 mm) | | | | | | |
| Pt—Pt—Rhodium | | | | | ——— | | (1 mm) | | | | |
| Chromel-Alumel | | | | | ——————— | | | | (0.5 mm) | | |
| C—Si—Carbonate | | | | | | | ——————— | | | | |

*Junction Pyrometer
**(——— For ordinary use    For overheat use)

THERMOELECTROMOTIVE FORCE
Chromėl-Alumel Thermocouple (CA)
(unit: [mV])

| t[°C.] | 0° | 10° | 20° | 30° | 40° | 50° | 60° | 70° | 80° | 90° |
|---|---|---|---|---|---|---|---|---|---|---|
| −100 | −3.49 | −3.78 | −4.06 | −4.32 | −4.58 | −4.81 | −5.03 | −5.24 | −5.43 | −5.60 |
| (−)0 | −0.00 | −0.39 | −0.77 | −1.14 | −1.50 | −1.86 | −2.20 | −2.54 | −2.87 | −3.19 |
| (+)0 | 0.00 | 0.40 | 0.80 | 1.20 | 1.61 | 2.02 | 2.43 | 2.85 | 3.26 | 3.68 |
| 100 | 4.10 | 4.51 | 4.92 | 5.33 | 5.73 | 6.13 | 6.53 | 6.93 | 7.33 | 7.73 |
| 200 | 8.13 | 8.54 | 8.94 | 9.34 | 9.75 | 10.16 | 10.57 | 10.98 | 11.39 | 11.80 |
| 300 | 12.21 | 12.63 | 13.04 | 13.46 | 13.88 | 14.29 | 14.71 | 15.13 | 15.55 | 15.98 |
| 400 | 16.40 | 16.82 | 17.24 | 17.67 | 18.09 | 18.51 | 18.94 | 19.36 | 19.79 | 20.22 |
| 500 | 20.65 | 21.07 | 21.50 | 21.92 | 22.35 | 22.78 | 23.20 | 23.63 | 24.06 | 24.49 |
| 600 | 24.91 | 25.34 | 25.76 | 26.19 | 26.61 | 27.03 | 27.45 | 27.87 | 28.29 | 28.72 |
| 700 | 29.14 | 29.56 | 29.97 | 30.39 | 30.81 | 31.23 | 31.65 | 32.06 | 32.48 | 32.89 |
| 800 | 33.30 | 33.71 | 34.12 | 34.53 | 34.93 | 35.34 | 35.75 | 36.15 | 36.55 | 36.96 |
| 900 | 37.36 | 37.76 | 38.16 | 38.56 | 38.95 | 39.35 | 39.75 | 40.14 | 40.53 | 40.92 |
| 1000 | 41.31 | 41.70 | 42.09 | 42.48 | 42.87 | 43.25 | 43.63 | 44.02 | 44.40 | 44.78 |
| 1100 | 45.16 | 45.54 | 45.92 | 46.29 | 46.67 | 47.04 | 47.41 | 47.78 | 48.15 | 48.52 |
| 1200 | 48.89 | 49.25 | 49.62 | 49.98 | 50.34 | 50.69 | 51.05 | 51.41 | 51.76 | 52.11 |
| 1300 | 52.46 | 52.81 | 53.16 | 53.51 | 53.85 | 54.20 | 54.54 | 54.88 | | |

THERMOELECTROMOTIVE FORCE
Chromel-Constantan Thermocouple (CRC) - (ISA)
(Abs.[mV])

| [°C.] | 0 | 10 | 20 | 30 | 40 | 50 | 60 | 70 | 80 | 90 | 100 |
|---|---|---|---|---|---|---|---|---|---|---|---|
| −100 | −5.18 | −5.52 | −6.04 | −6.44 | −6.83 | −7.20 | −7.55 | −7.87 | −8.17 | −8.45 | −8.71 |
| −0 | −0.00 | −0.58 | −1.14 | −1.70 | −2.21 | −2.77 | −3.28 | −3.78 | −4.26 | −4.73 | −5.18 |
| +0 | 0.00 | 0.59 | 1.19 | 1.80 | 2.41 | 3.04 | 3.68 | 4.33 | 4.99 | 5.65 | 6.32 |
| 100 | 6.32 | 7.00 | 7.69 | 8.38 | 9.08 | 9.79 | 10.51 | 11.23 | 11.95 | 12.68 | 13.42 |
| 200 | 13.12 | 14.17 | 14.92 | 15.67 | 16.42 | 17.18 | 17.95 | 18.72 | 19.49 | 20.26 | 21.04 |
| 300 | 21.04 | 21.82 | 22.60 | 23.29 | 24.18 | 24.97 | 25.76 | 26.56 | 27.35 | 28.15 | 28.95 |
| 400 | 28.95 | 29.75 | 30.55 | 31.36 | 32.16 | 32.96 | 33.77 | 34.58 | 35.39 | 36.20 | 37.01 |
| 500 | 37.01 | 37.82 | 38.62 | 39.43 | 40.24 | 41.05 | 41.86 | 42.67 | 43.48 | 44.29 | 45.10 |
| 600 | 45.10 | 45.91 | 46.72 | 47.53 | 48.33 | 49.13 | 49.93 | 50.73 | 51.54 | 52.34 | 53.14 |
| 700 | 53.14 | 53.94 | 54.74 | 55.53 | 56.33 | 57.12 | 57.92 | 58.71 | 59.50 | 60.29 | 61.08 |
| 800 | 61.08 | 61.86 | 62.65 | 63.43 | 64.21 | 64.99 | 65.77 | 66.54 | 67.31 | 68.08 | 68.85 |
| 900 | 68.85 | 69.62 | 70.39 | 71.15 | 71.92 | 72.68 | 73.44 | 74.20 | 74.95 | 75.70 | 76.45 | linear characteristic to temperature; (2) even being under a long term exposure with high temperature, its wear or loss to be small, without any change in its metal formation or composition; (3) the same kind of thermocouples to always have the same electromotive force, and the like; and so, thermocouple-thermometers are actually fit for high temperature measuring (References: 'DENKI KOJI HIKKEI' (electric work handbook) editionally supervised by HASUI, Takao, issued by SANSEIDO Co., Ltd., Feb. 25, 1978, 3rd Ed., and Tables etc.); therefore, moreover, thermocouple-thermometer i.e. junction pyrometers may be possible for their reversed utilization to electromotive force devices, with a partial circuit modification etc. or with applying or an addition of a switching circuit, and the like.

Figure 2B:
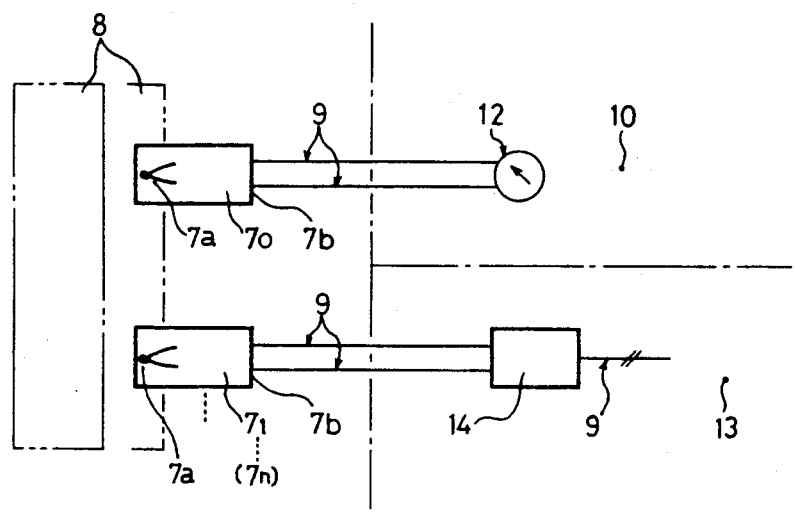

The method of reversed utilization of thermocouple-thermometers aims to gain an effect of a thermocouple as a thermoelectromotive substance and/or thermoelectromotive device by reversely utilizing a thermocouple-thermometer i.e. junction pyrometer. An illustration of the above circuit systems is as shown in FIG. 2 etc., as follows: The most simple way is consisted of a circuit switching the circuit from a thermocouple 7 namely here which is a thermocouple-thermometer (: junction pyrometer) to its own thermal indicator 12, as it were, into a circuit to the battery equipment 14 including charging-, accumulating-, and discharging-equipment and circuits, and others. Explaining the form of the said circuit system with the drawings, it is as follows: First, FIG. 2(A) represents the case of the switching circuit inserted mode in an illustration of the reversed utilization of a thermocouple-thermometer as a thermoelectromotivator. The system is consisted of a single thermocouple (thermometer) 7, with its line element i.e. its high temperature side 7a (thermo-measuring position side) as a photo-accepter, and a switching circuit 11 inserted in the serial circuit from its low temperature part side 7b which is the leading wire extracting hole side (a waterproof plug attached, etc.) the standard position or cold junction, to its thermal indicator 12. This switching circuit 11 is also a measured temperature indicating circuit. Its operation is that: when switching ON the switch SW transient (only when pushed, it becomes ON; if detaching the hand, it becomes OFF, and so forth) (* if necessary, it may be designed to enable to switch through a solenoid key K, etc. composing a timely or periodically automatic switching indicator circuit, with connecting to a timer etc.), the relay X operates, to make (M) the relay $x_1$ contact, and to break (B) the relay $x_2$, and then the thermal indicator circuit operates. These SW (or K), relay, X, and its contacts $x_1$, $x_2$ are not hold (UH—unhold); they are transient. With the above, this system enables to, only when necessary measure temperature of a thermo-measured substance or heat source 8, read the reference of the thermal indicator 12, e.g., in the control center/room (instrument room) (* if necessary, also to record), and so forth, as far as unnecessary, the circuit to the battery equipment 14 in the electricity room (converter/transformer room etc.) and others operates, to gain accumulation of the motivated electricity by the electromotive force through the thermocouple(s) 7. Next, in (B), without providing a by-pass circuit for temperature measuring, e.g., in the case of on-line and remote-batch system measuring and the like, a parallel circuit system employs plural thermocouples, individually for temperature measuring (ordinarily, one) and for electromotivation and accumulating (one or more), in this method. Explaining an illustration of the circuit system, simply with the drawings, as follows: FIG. 2(B) represents an illustration of the reversed utilization of thermocouple-thermometers (junction pyrometers) as a thermoelectromotive device, in a combined mode with both a temperature measuring and indicating circuit and thermoelectromotive and battery circuits. The form is as follows: Applying the thermocouple-thermometers $7_0$, $7_1$(...n) set towards/at etc. a heat source/thermal substance 8, for the purpose of temperature measuring, the circuit is to be as usual connected to the thermal indicator 12, and for the purpose of (exclusive) thermoelectromotivation, the circuit is to be connected instead of a thermal indicator 12 i.e., not to the thermal indicator 12, but only to the battery equipment 14 the leading wires 9 from their leading wire extraction hole (low-temperature part) side 7b. A thermal indicator, in this case, may be set in the control room (instrument room) 10 and the like, and the battery equipment 14 is to be in the electricity room (convertor/transformer room) 13 and the like. With the above, on-line and remote-batch system of thermal indicating with monitoring etc. becomes possible; at the same time, thermoelectromotivation through thermocouples becomes also possible.

Thus, with the above, since the method of the reversed utilization of a thermocouple-thermometer as a thermoelectromotivator is that to make its thermo-measured substance/heat or heat substance as a heat source or a thermal substance of thermoelectromotivation by means of the said manner—the thermocouple-thermometer 7 set towards or at a heat source or thermal substance 8 is to be used for a thermoelectromotivator; connecting, as it were, to a bypass- or switching-circuit, serially; or parallelly with another/other one(s) similar but only instead of its thermal indicator, to the battery circuit,—as far as there be any special reasons, it may be possible that, generally, wherever if industrially employing thermocoule-thermometers (junction pyrometers), this thermocouple-thermometer reversely utilized thermoelectromotive device's employment and/or combination is to be possible, and by this reversed utilization of the thermocouple-thermometer as a thermoelectromotivator, homemade electric generation, partial (or a part of) homemade generation and/or supplementally supplying electric power source and the like may be made possible.

Moreover, it is an essential component of this inventional device, the composite electromotive apparatus utilizing solar energy and the like, in particular in its thermolectromotive unit system; that is, taking solar energy and/or the like in place of the thermal substance/heat source in this principle of thermoelectromotivation by means of reversed utilization of thermcouple-thermometers is this inventional composite electromotive apparatus utilizing solar energy and the like (: solar etc. energetic composite electromotivator).

Figure 3:
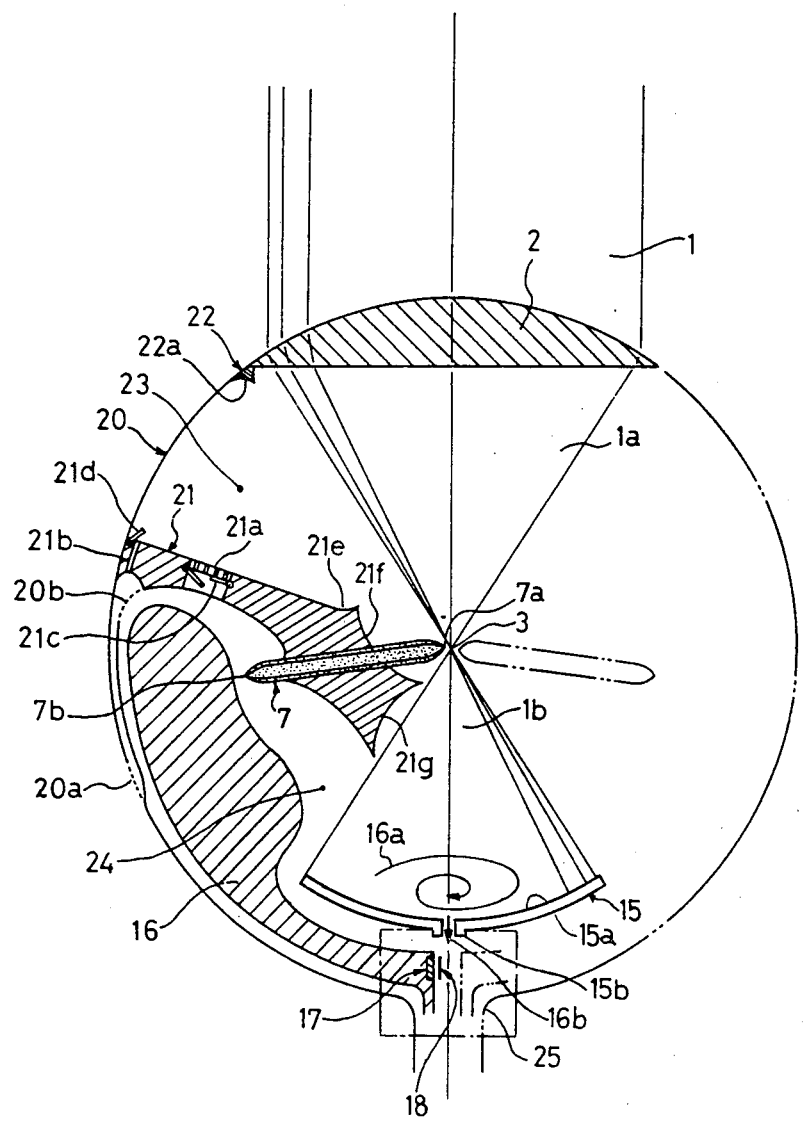
FIG. 3 shows an illustration of this invention, mainly expressed by a one-side omitted vertical section through the center line of the mostly global body of the illustrated apparatus, representing the essential elements' composition.

FIG. 3 shows an illustration of this invention, mainly expressed by one-side omitted vertical section through the center line of the mostly global body of the illustrated apparatus, representing the essential elements' composition, a schematic diagram. Its composition is as follows: The essential elements of this apparatus are generally involved in a mostly transparent and global vessel or container 20 (heat-resisting and fireproof, explosionproof, windproof, waterproof, semi-airtight, etc.). It contains a lens (convex) 2 as a heat-collecting condenser, and provides pore(s) (with vent capillary/-channel and filter) (outside opening) 20a and (inside opening) 20b; at the focal point 3 of the lens, that is the center of the apparatus vessel 20 (globe center of the apparatus, or the like) 3, thermocouple high-temperature part side/thermoposition(s) is/are positioned, that is the thermoelectromotive unit providing the said thermocouple(s) or a thermocouple elements disk 7 as a thermo-accepting thermoelectromotivator; supporting which a spacer 21 is set for dividing and consisting the high-temperature room side 23 and the low-temperature room side 24 and so forth; the photovoltaic unit, which accepts sun-light etc. 1 diffused rays after converged 1b with a photovoltaic accepter/unit 15; a suction type cooling fan 16, which utilizes convention etc. and acts for heat removal from and cooling etc. the thermocouple low-temperature part side 7b and the photo-accepter (photovoltaic elements unit) 15a, and others; a magnetic electromotive unit 17 (in direct mode), which operates driven by rotation of the fan 16 etc.; and others; including other constructions for repeated utilization of suction air etc. which will become air current for photo-accepter heat removal ventilation 16a, passing through a venting route 16b etc. and through lead wire path(s) 28a (FIG. 4) etc., the air may be designed for reutilization and the like for rotation acceleration or the like. This operates as follows: Sunlight (etc.) 1 is heat-collected and photo-condense through a convergence effect by a lens 2 including a centripetal heat-collecting and photo-condensing effect and the like by a global vessel 20 of the apparatus, at the lens focal point 3 positioned at the globe center of the apparatus, or the like 3; the diffused rays of sunlight or the like after converged 1c are thermo-accepted and thermo-focused at the high-temperature part side 7a of the thermocouple 7 or the central part side 7a of a thermocouple elements disk 7 which is a compound thermocouples substance/element in a form like topless-conic, conic, or others' for strengthening the effects of thermocouples, those sides are positioned at the said lens focal point/the apparatus globe center or the like 3. Then, this themoelectromotive unit system displays its functional performance of thermoelectromotivation by the thermocoufple's Seebeck effect through temperature differentiation between the said high-temperature part side 7a and the low-temperature part side (the circumference part side of the thermocouple elements disk) 7b, including the thermocouple's Pertier effect which arises by that motivated electric current being charged on the thermocouple line element furthermore improves electromotive efficiency together with the fomer effect, because the latter effect and the like raises temperature differentiation more with its result of the cooling effect on the low-temperature part side 7b i.e. the standard position/cool junction; and thus, this thermoelectromotive unit performs the said function efficiently by utilizing solar heat and the like as a heat source. Besides, in the photovoltaic unit system, its component, photovoltaic accepter and elements unit 15 accepts the sunlight etc. 1 diffused rays after converged 1b in the photo-accepter 15a i.e. a photovoltaic elements bowl or the like in a shape of a cup or others e.g. in a form as a spheric part or the like with the center point set at the focal point 3 in order to make its photo-accepting efficiency enlarged; the convection utilizing etc. suction mode cooling fan 16 performs its cooling function for heat removal to raise the photovoltaic functional action and effect of the photo-accepter (photovoltaic elements unit) 15a that is the essential body of the photovoltaic unit system, and for aiding the temperature differentiation effect at the thermocouple low-temperature part side 7b and so forth. With the fan's face 16 rotation, photo-accepter heat removal ventilation 16b is set towards and into the photovoltaic unit neck vent 15b to remove heat from the photovoltaic accepter/elements unit, at the same time the venting air enables to be reutilized and/or utilized for rotation acceleration or the like, as well as to raise both photovoltaic and thermoelectromotive effects, moreover, the rotation of the fan 16 works for the magnetic electromotive/electric generator unit 17. In the magnetic electromotive unit system, in the case of direct mode, the magnetic electromotive/electric generator unit 17 is involved and installed along/inside the inner wall surface of the fan 16 neck (ring-shaped rotation axis site) of the fan 16 neck, and the fan 16 rotation drives the magnetic electromotive unit 17 (in the case of indirect mode, i.e., if inevitably, through a wing wheel or the like by means of the sent air and others from and passing through the venting route(s) 16b etc. with the fan 16 rotation caused by convection and others, so-called an electric generator and the like is driven); and the magnetic electromotivation/electric generation is made possible and efficient. This fan 16 rotation driven magnetic electromotive unit 17 system provides so-called magnetic electromotivation function based on the well-known electromotive principles; a detailed schematic and isometric drawing of an illustrated neck construction of this apparatus body composed with the said unit 17 is as shown in FIG. 4. The spacer 21 divide together with the thermocouple elements disk 7, this apparatus vessel 20 inside into high-temperature room side 23 and low-temperature room side 24, supports the thermocouple elements disk 7 and the like, and is available for a part of leading wire routes, or others, but not limited the above, together with the apparatus vessel 20 mostly global and transparent (at the bottom side, shading off semi-transparent through opaque may be permissible), which provides pores with vent capilary/channel and filters (outside opening and inside opening) 20a, 20b, the spacer 21 also provides the air adjusting openings with filters, (from warm to cool) 21a and (from cool to warm) 21b, and air adjusting valves, (from warm to cool) 21c and (from cool to warm) 21d, for promoting or aiding the fan's 16 rotation through convection etc. caused by temperature differentiation etc. by those designs; in addition to the above, the spacer 21 is designed to have a cool air current controling rim (brim) 21e, high-temperature reflecting and holding wall surface 21f, cool vent protecting/controling wall surface 22, etc. those are convection controling wall surfaces and so forth to promote the convection's directivity or hindrance, and others, including those through the lens fixture 22 etc. with the convection controlling rim surface etc. (except the case of the lens unified with the apparatus vessel), all the above are useful for the aimed effect of convection, furthermore the spacer 21 is helpful for protecting and holding the temperature differentiation between the low-temperature part side 7a and the high-temperature part side 7b of the thermocouple or the thermoelectromotive elements disk 7; besides, the spacer 21 serves for heat avoidance of the photo-acceptor 15a i.e. a kind of photovoltaic elements disk/unit body 15 and other effects and functions it performs.

Figure 5:
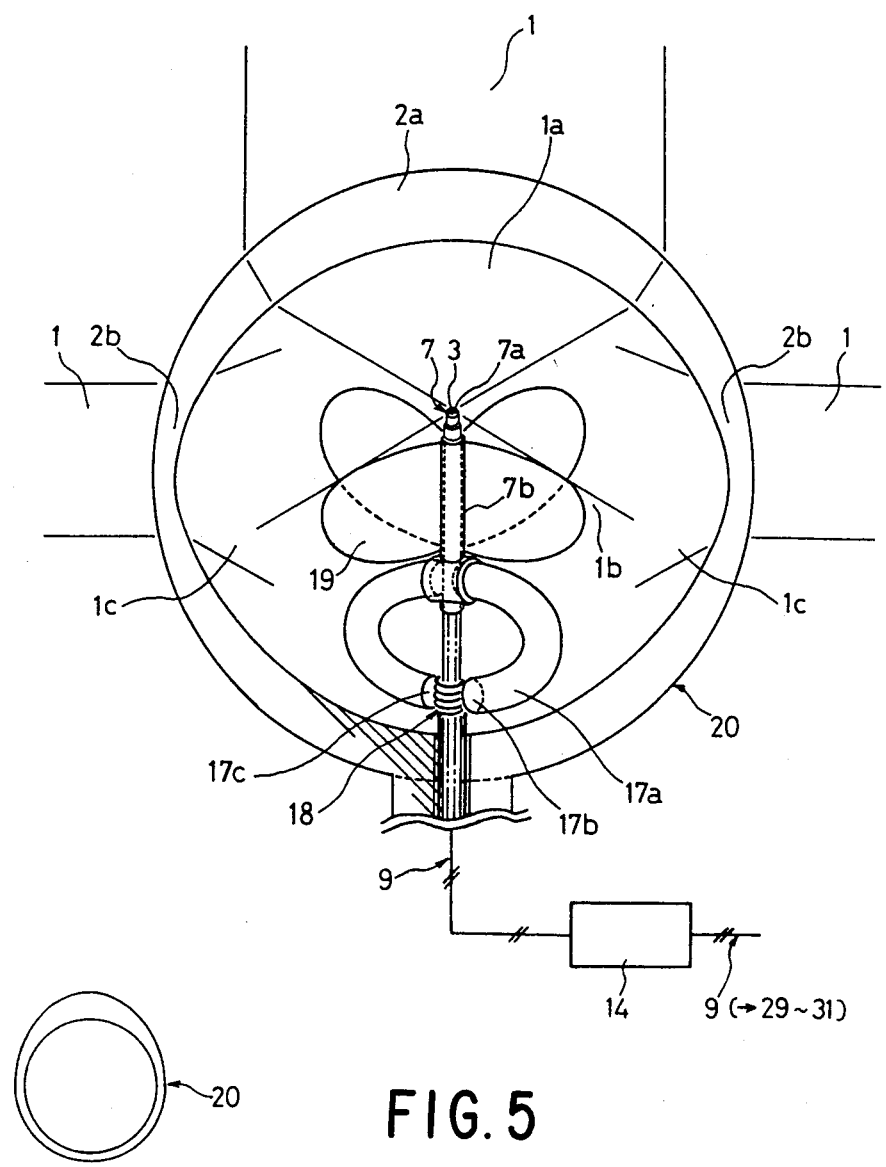
FIG. 5 shows an illustration of another mode of this invention apparatus assemble for the mostly global vessel of which is represented by center-lined vertical section, perspective, and other main units' elements by a schematic and isometric drawing assembled, representing the elements composition, with some connections succeeded in a brief block diagram.
Figures 6A, 6B, 6C:
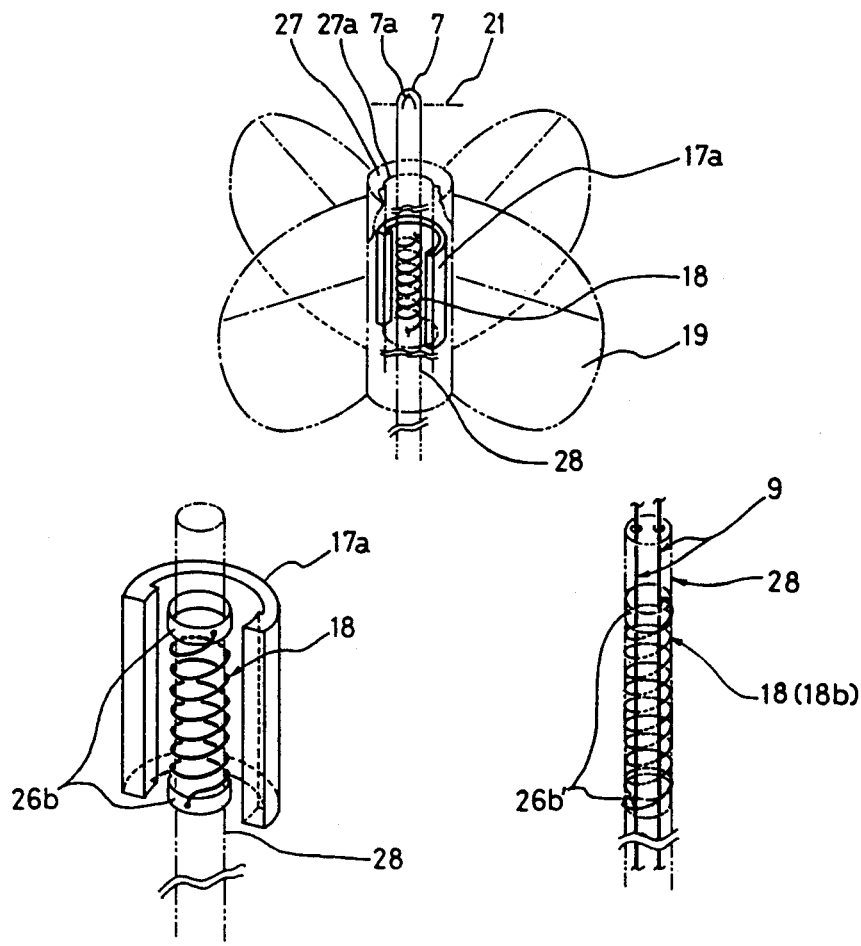
FIG. 6 shows the other illustration of the construction than the above, of this inventional apparatus, represented by a schematic and isometric drawings of some main elements and their assembly, concerning the elements of a photo-acceptor fan rotator/rotor, with the involved magnectic electromotive/electric generater and/or other unit(s), as follows: (A) shows a schematic representation of assembly of the photo-accepter fan rotator involving; (B) shows a detailed schematic drawing of the said fan rotator core side inner wall and the core assembly detailes; (C) shows a schematic representation of an illustrated connection composition of contactors with the inner wall, an involved coil, the core elements (including a thermocouple's insulating tube), conducting lead wires inside the insulating tube, etc.; where: 1 Sunlight (etc.) 1a Converged rays of light 1b Diffused rays of light after converged 1c Diffused rays of light 2 Lens (portion) (convex or concave) 3 (lens) focal point (globe center of the apparatus, or the like) 4a Crayon pieces with various colors 4b Each-other melted and colorfully mingled (pasty) crayon solution 5a A black paper piece 5b The focal point on the black paper piece 6 A small bowl 7 Thermocouple(s) (thermocouple-thermometer, thermocouple elements disk, etc.) 7a (Thermocouple) high-temperature part side/thermo-position (the central part side of the thermocouple elements disk) 7b (Thermocouple) low-temperature part side (the circumference part side of the thermocouple elements disk) 8 Heat source (thermal substance, thermo-measured substance) 9 Conducting lead wires/leading wires 10 Control center/room (instrument room) 11 Switching circuit (thermal indicator circuit) 12 Thermal indicator 13 Electricity room 14 Battery equipment 15 Photovoltaic ac/el. unit 15a Photo-accepter 15b Photovoltaic unit neck (vent) 16 Fan 16a (Photo-accepter) heat removal ventilation 16b Venting route 17 Magnetic electromotive/electric generator unit 17a Permanently magnet 17b Magnetic pole N (or S) 17c Magnetic pole S (or N) 18 Coil (portion) 18a (An illustration of) multi-coil type 18b (An illustration of) printed coil type 19 (Radiator) photo-accepter fan rotator/rotor 20 Apparatus vessel 20a Pore (with vent capillary/channel and filter) (outside opening) 20b Pore (with vent capillary/channel and filter) (inside opening) 21 Spacer 21a Air adjusting opening (with filter) (from warm to cool) 21b Air adjusting opening (with filter) (from cool to warm) 21c Air adjusting valve (from warm to cool) 21d Air adjusting valve (from cool to warm) 21e Cool air current controlling rim (brim) 21f High-temperature reflecting and holding wall surface 21g Cool vent protecting controlling wall surface 22 Lens fixture (with convection rim surface) 22a Cool air current controlling surface 23 High-temperature room side 24 Low-temperature room side 25 Apparatus neck 26 Generated electric current collector unit 26a Slip ring (for AC), commutator (for DC), etc. 26b Contactor (brush) (etc.) 27 Frame 27a Frame inner wall 28 Insulating tube 28a Ventilation route etc. (if necessary) 28b Lead wire path (for electromotivated current) (etc.) 29 Controlling/adjusting equipment/circuits, etc. 30 Current/voltage transforming equipment/circuits, etc. 31 Transmitting/supplying equipment/circuits, etc. (to - - - )

What is shown in FIG. 4 is a detailed schematic and isometric drawing of an illustrated neck construction of this inventional apparatus body (FIG. 3), representing a typical assembly of the magnetic electromotive unit (direct-mode), with a brief block diagram of its connecting devices, circuits, etc., which are similar to those in other illustrations (FIG. 5, FIG. 6). Explaining with the drawing etc., an illustrated form is as follows: The construction of the fan neck (magnetic electromotive-/electric generator-unit frame) 27, which is positioned in the apparatus neck 25, rotation axis site is such that: the rotation axis bearing contact is to be between the inner wall side surface of the apparatus body and outside the outer wall i.e. enclosure of the fan neck (frame) 27 and the like; in/on the surface of the frame inner wall 27a of the fan neck 27, a permanent magnet 17a with magnetic poles, N and S, 17b and 17c is involved; further, the ring-shaped frame inner wall encircles an element of coil 18. The drawing only schematically expresses the coil 18 with one of turns, i.e. n=1, in actuality, great numbers of turns, i.e. n multipled x=nx, in its construction. Besides, the coil 18 portion crossing the magnetic flux, and the like, is to be consisted of multi-coil type 18a or the like, based on the considerations of effectiveness and efficiency. An illustration of the multi-coil type construction is made of a coil which is consisted of a spiral electric-conductor, that is a coil made of a coiled conductor—coil of coil—and so forth. The axis site of such a coil may involve the magnetically conductive) insulating tube etc. containing the electromotivated current lead wire path etc. 28b as a general leading wire route and so forth from the thermocouple elements disk 7 etc. and/or from the photovoltaic accepter/elements unit 15 etc., or as a route for leading wires etc. from the thermocouple 7 protecting tube, and the thermocouple 7 as a thermoelectromotive unit, and others. By the way, as for lead wire paths, other than the said involved type, depending on the ambient conditions and others, those in outside and flexible type may be also available. The ventilation route (etc.) 28a of the insulating tube 28 (if necessary,) is to be designed as usefully as required for ventilation circuits and others; i.e. according to the environmental conditions, use conditions, etc., e.g., not necessarily to pass through the insulating tube 28, there may be the case constructed only for ventilation circuits etc. up to required for reutilization to promote the fan 16 rotation; or construction, according to necessities, enabling to provide automatic control switching valves etc. by wind pressure, air pressure, etc. to the ventilation and/or air current routes, and so forth. The operation of the magnetic electromotive/electric generator unit system is that: by means of the fan 16 rotation, the rotation of the N and S poles, 17b, 17c, of the parmanent magnet 17a, which are involved in and directly connected to the fan 16 and its rotation, results for the coil 18 with the efficiency risen by an illustrated multi-coil type 18a etc. the magnetic flux between both magnetic poles, N and S, 17b, 17c; magnetic electromotivation becomes possible.

By that the electromotivated current lives in the coil 18 and others, the permanent magnet 17a rotation becomes furthermore multiplied, affecting the fan 16 drive and others directly connected to the unit, and as the results of the said inter-multiplication, the effects of the composite electromotivation are to be increased.

Thus, compositely generated electricity is taken through the magnetic electromotive unit 17 or the generated electric current collector unit 26 (in the case of the existing electric generator etc., according to the need, including slip rings for AC, etc., commutators for DC, etc. 26a, contactors (brush) 26b, and others), and sent through leading wires 9 and circuits, to the battery equipment 14 and circuits with charging, accumulating and discharging, and the equipment and circuits for controling/adjusting, and others 29, the equipment and circuits for current/voltage transforming, etc. 30, and/or the equipment and circuits for transmission/supply etc. 31, through necessary mechanical or electric systems, equipment, circuits, and others, to motors or other necessary equipment, circuits, terminal apparatus, facilities, and others.

In addition to the above basic operation and effects of the composite electromotivation, a benefit of the above operation and effects of this apparatus is, moreover, like this. As for a venting route system, by means of the fan 16 rotation, the photo-accepter heat removal ventilation 16a is sucked and passed through the sunlight receipt photovoltaic unit neck vent and father a ventilation route etc. 28a, and reutilized or partly used for the fan 16 rotation drive rotation speed acceleration etc. promoted as a sent-wind, and the rest ventilation or air current may be sent to connect to other piping etc., if necessary, e.g., to such a generator's drive with rotating wing wheels as for remote and/or indirect facilities, and the like, including other sent-wind requiring facilities with utilized routes and other piping, etc. As in the above, such reutilization or part utilization and the like of the heat removal ventilation air current 16a, including the rest of that utilization bring effects such as: in particular, with promoting the fan 16 rotation, rotation speed acceleration etc. assembly for a period. Besides in the electric and/or magnetic circuits systems, as the electromotivated current lives and flows into and through the insulating tube 28b, with the electric and magnetic characteristics and the like, the rotation of the parmanent magnet 17a of the magnetic electromotive unit 17 becomes more raised, and the more their associated inter-multipled effects increased and the total efficiency of cooling heat removal, electromotivation/electric generation and the like is furthermore exalted.

Thus, in an illustration of the composite electromotive apparatus/device utilizing solar energy and the like, there are effects to enable to gain electromotivation/electric generation always constantly, or regardless of the sunshine or the like, without spending huge spaces; in particular, when sunshining, duplicated or more effects can be expected, through their inter-multipled operation and effects.

FIG. 5 shows an illustration of another mode of this inventional apparatus the mostly global vessel of which is represented by a center-lined vertical section, perspective, and other main units' elements by a schematic and isometric drawing assembly, representing the elements composition with some connections succeeded in a brief block diagram. Explaining the form with the drawings etc., its construction is as stated herein below. Involved in a container or vessel 20 (heat resistant, fireproof, explosionproof, windproof, waterproof, etc.) which is a transparent sealed vessel providing a lens(-portion) convex 2a and a lens(portion) concave 2b and the like faces by thickness flection of the vessel, from its external to internal (or from its egg-shape external to its global internal, etc.) and the like; at the convex lens focal point, the thermocouple 7 high-temperature part side (i.e. thermo-position) 7a is positioned; making the low-temperature part side (i.e. protecting tube and others' side) 7b or the like as a rotation axis, the rotation of the radiator photo-accepter fan rotator/rotor 19 is connected or interlocked with the permanent magnet(portion) 17a to rotate, between which poles, 17b, 17a, there are equipped coil(s)/coil portion 18. As for the operation, when solar energy or the like heat-collecting and photocondensing occurs at the focal point 3 of the convex lens portion 2a, on one hand, the thermocouple high-temperature part side 7a being heat-collected, thermoelectromotivation operates, on the other hand, diffused rays of sunlight etc. after converged 1b and the rays of sunlight etc. diffused and effectuated 1c through the concave lens portion etc. of the apparatus vessel 20 are accepted by the radiation photo-accepter fan rotor 19 which has also radiator factors so-called 'radiator' and the fan rotor is rotated by the radiation phenomena and the like; with its own rotation, its heat removal etc, being made, the fan rotor 19 enables to realizes the photovoltaic motivation and make it effective.; at the same time, the photo-accepter fan rotor 19 rotation actuates the so-called magnetic electromotive/electric generator unit system functional construction providing the parmanent magnet 17a which is connected or interlocked to the said fan rotor 19 and the coil (electricity element) set between the both poles, 17b, 17c, of the parmanent magnet acrosses the magnetic flux, and then, so-called magnetic electromotivation/electric generation becomes possible; resulting, the photo-accepting rate of the radiator photo-accepter fan rotor of the photovoltaic unit becomes hightened with the transparent and sealed apparatus vessel 20 with convex and concave lens portions, 2a, 2b, etc. and by the diffused rays of light after converged 1b as by the converged rays of light 1a at the thermoelectromotive unit system, and the diffused rays of light. Besides, this photo-accepter fan rotor 19 performs both functions as a photo-accepter and a fan etc., and also functions as a radiator, and so, this can be designed in single and simplified mode of construction; moreover, since the more photo-accepting, the more rotation as a radiator associates, the heat removal concerning the photovoltaic electromotivation as a photovoltaic substance/element, is conducted by its element body itself, then, photovoltaic function as a photo-accepting substance/element is also increased; and its effectuated rotation raises the said coil 18 crossing magnetic flux between the said both poles 17b, 17c of the permanent magnet 17a of the magnetic electromotive unit 17 which is rotatingly directly connected to the fan rotor 19, to also effect on the magnetic electromotive functional efficiency; moreover, when coil 18 etc. is electrically actuated, the rotation is further accelerated by electric and magnetic characters, too, resulting in the total electromotive force of the magnetic electromotive unit system and other systems being also increased; thus, the inter-multipled effects are expected. In addition to the above, as for the use of this radiator photo-accepter fan rotor 19, its cooling and heat-removal function concerns holding and strengthening the temperature differentiation between the thermocouple 7 high-temperature part side 7a and its low-temperature part side 7b, and so, it is also effective for the thermoelectromotive unit system; including another effectiveness like that: with the functional characteristics as a radiator, even when it is no sunshine or the like, if there is any substitutional light source/energy (e.g. even if at night or others, if there be any light source e.g. actuated by photoelectrons etc. switching etc., lighting light, reflecting light, or the like) is given, by the composite electromotive apparatus device characteristics, even if small but compositely and always and-/or constantly motivated electricity can be gained.

FIG. 6 shows the other case of the illustration of the construction than the above (FIG. 5) of this inventional apparatus concerning its essential components/main elements represented by a schematic and isometric drawings and their assembly, in regard to the elements of a photo-accepter fan rotator/rotor, with the involved magnetic electromotive/electric generator and/or other unit(s), as follows: (A) shows a schematic representation of assembly of the photo-accepter fan rotator/rotor involving; (B) shows a detailed schematic drawing of the said fan rotor core side inner wall and the core assembly detailed; (C) shows a schematic representation of an illustrated connection composition of contactors with the inner wall, an involved coil, the core elements including a thermocouple's insulating tube, conducting lead wires inside the insulating tube, etc. In this case of the illustration, the construction is such that: in the rotation axis core side inner wall surrounding of the radiator photo-accepter fan rotor 19 of the photovoltaic unit system which is one of the essential components of this inventional apparatus, there is involved a magnet 17a, a coil portion 18 and others of the magnetic electromotive/electric generator unit system, i.e., the both systems' functional constructions are combined in a unitary body of elements. As for the radiator photo-accepter fan rotor 19, just as the case illustrated and shown in FIG. 5, the composition may be in either type divided into a radiator functional division and a photo accepter functional division (as the case (A)), or formed with mingled both sites of radiator functional factors' sites and of photovoltaic-accepter functional factors' sites. As the same as the above, the parmanent magnet 17a functional factors constructional elements are also combined in one body or made in a unified body with the said radiator photovoltaic-accepter fan rotor, rotating, and farther increase inter-multiple effectiveness of the coil 18 element set in the axis core side of the fan rotor/the magnet surrounding, to cross the magnetic flux, and others; thus, those are assembled as explained as in FIG. 5, so that it brings a heightening of the composite electromotive effectiveness.

In the above case, the construction of the coil 18 element, e.g., if it is the case of a large body type of the composite electromotive apparatus utilizing solar energy and the like, coil turn layers and/or numbers of the coil turns may be increased, while, if it is the case of a small type of the apparatus, by means of a printed type of the coil 18b etc., i.e., a coil mode in a method of a printed form such as winding on the axis core side of the outer wall surface of the protecting tube which is a insulating tube 28 including a conduit, depending on the apparatus scale or other conditions, directly on the axis or with another surrounding insulator/substance or the like on which the coil form is printed, and so forth; with the above designed construction, this type of the apparatus mode enables to gain the apparatus essential body in a small or ultra-small type or to aim for the apparatus to have high efficiency or the like, and enables to make it in an ultra-super small type etc., which is necessary for the apparatus to be in a compound type, or others.

Besides, as for the relation of the coil 18 to the contactor 26b etc., depending on the apparatus scales, e.g. in small or large, or other types, the contactor's 26b mode, construction, and so forth will be a little different from each other of them, however, as an illustration of that, e.g., the coil's 18 winding start and winding stop positions are to be, corresponding to the types, scales, etc., at the upper position, the lower position, etc. along the axis core, through bearing contact or other means, obtaining the electric contact through the contactor 26b ring-shaped or the like, between the rotator/rotor and the rotating axis core substance/element, to reach to the leading wires 9 etc. for motivated electricity passing through the insulating tube 28 etc. which has the contacting points with the contactor 26b' elements at the axis core site. Thus, the motivated electricity by photovoltaic electromotive force through the radiator photo-accepter fan rotor 19, and motivated electricity by magnetic electromotive force, motivated electricity by thermoelectromotive force the thermocouple 7 etc. as a thermoelectromotive substance/element which is, in this case, positioned along the said fan rotor's 19 axis or its core site (in other case, the thermocouple elements disk etc. 7), through the thermocouple protecting tube with leading wires involved and through the thermocouple expansion wires tube site, and then through the conduit site or an insulating tube 28, joining to the lead wire path 28b etc. or uniting and so forth, anyway passes through such wiring routes, and reaches to be sent to the battery i.e. charging and accumulating etc. equipment and circuits, and so forth.

In this case of the permanent magnet 17a involved type, in particular, the functional capacity and/or area etc. of the photovoltaic accepter/elements unit and the like can be effectively and largely allotted in a space, and fabricating simplification, besides, simplified and unitary construction, moreover, effects to bring further more electromotive force are expected.

INDUSTRIAL UTILIZATION POSSIBILITY

This invention is, as above-mentioned, suitable for a wide range of utilization with the following effectiveness: By means of the composite electromotive elements; composition and others such as a thermoelectromotive unit functional system and a photovoltaic unit functional system, utilizing the solar energy and the like, and a so-called magnetic electromotive/electric generator unit functional system, utilizing convection, radiation and other phenomena for wind force, rotating force, etc. to more raise the efficiency, and the like, to farther more heighten the electromotive effectiveness; with the above-mentioned one composite and united body acting electromotive functional construction, without taking/spending so much large or huge places/spaces which would be usually done, minimizing such limits as space, time, weather, environment, etc., corresponding to each utilization purpose, applying scale/rate, etc., it may be designed in a single body mode or a compound/multiple body mode, a large body type, a small body type, or others, and also designed not only for a body in a fixed installation style, but also for an attachment body style to a moving substance etc. or a portable body style, and so forth; besides, it enables to even small but always and accumulatively gain motivated electricity; moreover, when, by means of solar energy and the like, the efficiency and effectiveness of the thermoelectromotive force and the phototvoltaic electromotive force, or the the like, the efficiency and effectiveness of the magnetic electromotive force and the like are also increase regardless of the conditions of natural wind force or the like; and its total composite electromotive effect can be inter-multiplied and largely heightened; its electromotive capacity to be much enlarged.

What is claimed is:

1. A composite electromotive apparatus utilizing solar energy and the like, said apparatus comprising:
   at least one concave lens for use as a heat-collecting condenser;
   a thermoelectromotive unit system which utilizes the Seebeck effect and the Pertier effect comprising:
   thermocouple(s) (7) of which the high-temperature side(s) (7a) is/are positioned at the focal point (3) of the lens (2), said thermocouple acting as a thermo-acceptor and a thermoelectric motivator;
   a photovoltaic unit system having a unitary photo-acceptor;
   a fan means for removing heat from said photo-acceptor, said fan means rotating by itself by utilizing convection, radiation, and other phenomena; and
   a magnetic electromotive/electric generator unit system (17) driven by the rotation of the said fan means.

2. The apparatus of claim 1 in which said apparatus is comprised essentially of a simple and small body, said apparatus being multiflexible in that said thermoelectromotive unit, said photovoltaic unit, said fan means and said magnetic electromotive generator units each independently function and cooperatively work for electromotivation through said lens and fanning system.

3. The apparatus of claim 2 in which said apparatus has a spherical container comprising:
   a substantially transparent shell; at least one vent port having a filter for ventilation of said shell and one or more spaces with air adjusting valves and air adjustable wall surfaces for promoting and aiding said rotation of said fan means caused by convection resulting from a temperature differential in said thermoelectromotive unit system, said rotation drives, and said magnetic electromotive system.

4. The apparatus of claim 3 in which said magnetic electromotive unit system is driven by said rotation of said fan means and by the convection current induced from said electromotive unit system, or by the radiation induced from said photovoltaic unit system.

5. The apparatus of claim 4 in which the rotation of said fan means activates said magnetic electromotive unit system, the rotating shaft of said fan means contains said cold junction of said thermocouple.

6. The apparatus of claim 1 in which said photo-acceptor of said photovoltaic unit is positioned so that it receives unfocused or diffused solar energy through said concave lenses for avoiding the heat of the focused solar energy but receiving rays, almost all at the correct angle of incidence to the photo-acceptor surface to avoid said heat.

7. The apparatus of claim 6 in which said photo-acceptors are positioned to receive said solar energy rays with an angle of incidence of 90°.

8. The apparatus of claim 6 in which said fan means has at least one fan rotor blade under which said photo-acceptor is rotated and driven by utilizing convection or, a photo-acceptor fan rotor (19) with plural blades receives light radiation, the neck of said fan rotor comprising a magnetic electromotive unit, which is driven and actuated by the rotation of said fan rotor to increase the efficiency of said photovoltaic electromotivation.

9. A composite electromotive apparatus utilizing solar energy and the like, said apparatus comprising:
   at least one concave lens for use as a heat collecting condenser,
   a thermoelectromotive unit system which utilizes the Seebeck effect and the Pertier effect comprising:
   Thermocouple(s) (7) of which the high temperature side(s) (7a) is/are positioned at the focal point (3) of the lens portion (2), said thermocouple acting as a thermo-acceptor;
   a photovoltaic unit system having photo-acceptors;
   a fan means for removing heat from said photo-acceptors, said fan means rotating by itself by utilizing convection, radiation, and other phenomena; and
   a magnetic electromotive/elective generator unit system (17) driven by the rotation of the said fan means in which said apparatus is multiflexible in that said thermoelectromotive unit, said photovoltaic unit, and said magnetic elective generator unit each being capable of functioning cooperatively to add the currents and individually to produce electromotivation through said lens and fan means; and in which when said high temperature sides of said thermocouples are heated from solar energy, convection currents within said apparatus cause said rotation of said fan means and said rotation drives said magnetic electromotive/electric generator unit, said rotation removing heat from said photo-acceptor thereby increasing the efficiency of said photovoltaic unit, said rotation aiding the temperature differential of said low and high temperature junctions and increasing said thermoelectromotive unit system's efficiency.

10. A composite electromotive apparatus comprising:

a thermoelectromotive unit system which produces electromotivation when any heat source of energy exists at a high-temperature junction of a thermocouple;

a photovoltaic unit system which produces electromotivation when any photo energy exists; and and a magnetic electromotive unit system which produces electromotivation when any rotational force exists, such as convection, radiation, or wind;

said thermoelectromotive unit system, said voltaic unit system, and said magnetic electromotive unit system each being capable of functioning cooperatively and individually to produce electromotivation which will drive a magnetic electrosensitive/electric generator.

* * * * *